(12) United States Patent
Xie et al.

(10) Patent No.: US 11,251,228 B2
(45) Date of Patent: Feb. 15, 2022

(54) OPTICAL RECEIVER PACKAGE WITH BACKSIDE LENS-INTEGRATED PHOTODETECTOR DIE

(71) Applicant: Intel Corporation, Santa Clara, CA (US)

(72) Inventors: Boping Xie, San Ramon, CA (US); Ansheng Liu, Cupertino, CA (US); Olufemi Isiade Dosunmu, San Jose, CA (US); Alexander Krichevsky, Cupertino, CA (US); Kelly Christopher Magruder, Albuquerque, NM (US); Harel Frish, Albuquerque, NM (US)

(73) Assignee: Intel Corporation, Santa Clara, CA (US)

( * ) Notice: Subject to any disclaimer, the term of this patent is extended or adjusted under 35 U.S.C. 154(b) by 283 days.

(21) Appl. No.: 16/225,130

(22) Filed: Dec. 19, 2018

(65) Prior Publication Data

US 2019/0123109 A1 Apr. 25, 2019

(51) Int. Cl.
*H01L 27/30* (2006.01)
*G02B 6/42* (2006.01)
*H05K 1/02* (2006.01)
*G02B 27/09* (2006.01)
*G02B 7/04* (2021.01)

(52) U.S. Cl.
CPC .......... *H01L 27/305* (2013.01); *G02B 6/4204* (2013.01); *G02B 6/4206* (2013.01); *G02B 6/4214* (2013.01); *G02B 7/04* (2013.01); *G02B 27/0955* (2013.01); *G02B 27/0977* (2013.01); *H05K 1/0274* (2013.01)

(58) Field of Classification Search
CPC ... H01L 27/305; G02B 6/4204; G02B 6/4206; G02B 6/4214; G02B 7/04; G02B 27/0955; G02B 27/0977; H05K 1/0274
See application file for complete search history.

(56) References Cited

U.S. PATENT DOCUMENTS 4,460,259 A * 7/1984 Greivenkamp, Jr. ... G01S 17/46
396/106
9,746,608 B1 * 8/2017 Rabiei .................. G02B 6/4214
(Continued)

*Primary Examiner* — Georgia Y Epps
*Assistant Examiner* — Don J Williams
(74) *Attorney, Agent, or Firm* — Patent Capital Group

(57) ABSTRACT

Optical receiver packages and device assemblies that include photodetector (PD) chips having focus lenses monolithically integrated on PD die backsides are disclosed. An example receiver package includes a support structure, a PD die, and an optical input device. The PD die includes a PD, integrated proximate to a first face of the PD die, and further includes a lens, integrated on, or proximate to, an opposite second face. The first face of the PD die faces the support structure, while the second face ("backside") faces the optical input device. The optical receiver architectures described herein may provide an improvement for the optical alignment tolerance issues, especially for high-speed operation in which the active aperture of the PD may have to be very small. Furthermore, architectures described herein advantageously enable integrating a focus lens in a PD die that may be coupled to the support structure in a flip-chip arrangement.

20 Claims, 8 Drawing Sheets

(56) References Cited

U.S. PATENT DOCUMENTS

| | | | |
|---|---|---|---|
| 2005/0062119 A1* | 3/2005 | Gallup | G02B 6/4201 257/414 |
| 2015/0219847 A1* | 8/2015 | Mack | G02B 6/4286 385/14 |
| 2017/0097480 A1* | 4/2017 | Wang | H04B 10/25891 |

* cited by examiner

OPTICAL RECEIVER PACKAGE WITH BACKSIDE LENS-INTEGRATED PHOTODETECTOR DIE

BACKGROUND

The need for fast and efficient optical-based technologies is increasing as internet data traffic growth rate is overtaking voice traffic, pushing the need for optical communications. In optical communications, information is transmitted by way of an optical carrier whose frequency typically is in the visible or near-infrared region of the electromagnetic spectrum. A carrier with such a high frequency is sometimes referred to as an optical signal, an optical carrier, a light wave signal, or simply light. A typical optical communications network includes several optical fibers, each of which may include several channels. A channel is a specified frequency band of an electromagnetic signal, and is sometimes referred to as a wavelength.

Technological advances today enable implementing portions of optical communication systems at the integrated circuit (IC) (or chip) level, which provides advantages for use of optical communications in computer systems. For example, an optical receiver used in an optical communication system may include a photodetector (PD) implemented on a chip. Photodiodes may be used as PDs to detect light by converting incident light into an electrical signal. An electrical circuit may be coupled to the PD to receive the electrical signal representing the incident light. The electrical circuit may then process the electrical signal in accordance with the desired application.

Packaging of a PD implemented on a chip is not trivial. One challenge resides in the fact that, to achieve high-speed operation for a PD, for example 25 gigabit per second (Gb/s) and beyond, the active area of the PD is usually required to be very small, which makes efficient coupling of light from an optical input device (e.g., a waveguide) to the PD very difficult. Optical misalignment between the optical input device and the PD can significantly compromise such coupling.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
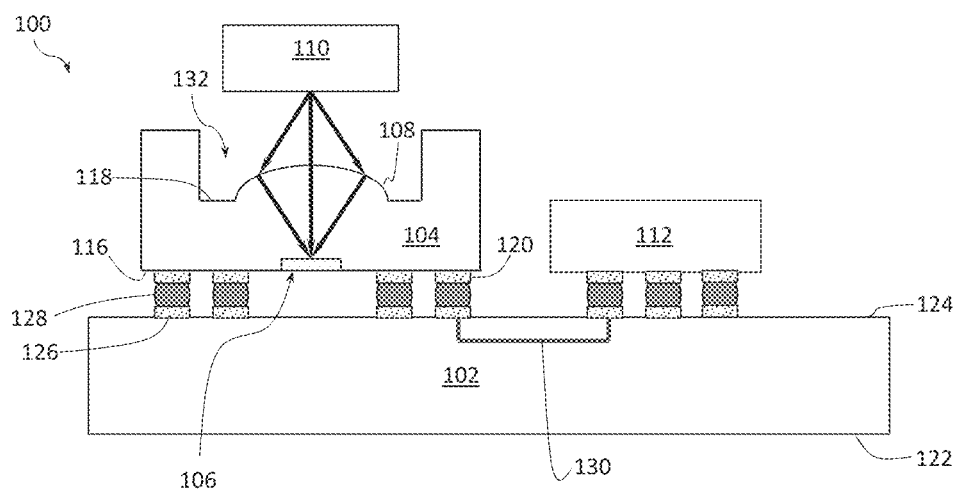
FIG. 1 is a schematic illustration of an optical receiver package with a backside lens-integrated PD die, according to some embodiments of the present disclosure.

For purposes of illustrating optical receiver packages described herein, it is important to understand phenomena that may come into play during packaging of PDs. The following foundational information may be viewed as a basis from which the present disclosure may be properly explained. Such information is offered for purposes of explanation only and, accordingly, should not be construed in any way to limit the broad scope of the present disclosure and its potential applications.

As briefly described above, packaging of a PD is not trivial because the active area, or aperture, of a PD that can be used for high-speed operation is very small, which makes efficient coupling of light from an optical input device to the PD difficult. The result can be that received light levels, detected by the PD, are so low that individual bits in the data stream in the optical signal become indistinguishable. When this happens, the optical receiver may not be able to recover the information from the data stream.

Coupling efficiency may be improved by using a focus lens between an optical input device and a PD die, in an attempt to direct the light exiting the optical input device to the active area of a PD. However, the use of focus lenses often has its own challenges. Namely, in a conventional implementation of a focus lens in an optical receiver package, an optical input device, a focus lens, and a PD die are provided as separate, or discrete, components. One disadvantage of such an implementation is that additional alignment and attachment steps associated with the use of a separate lens are needed. Another disadvantage is that the added alignment tolerance often has a negative impact on coupling loss and yield. Cost associated with the use of a discrete lens is yet another disadvantage.

Disclosed herein are optical receiver packages and device assemblies that include PD dies having focus lenses monolithically integrated on their backsides, as opposed to focus lenses being provided as discrete components. In one aspect of the present disclosure, an example optical receiver package includes a support structure (e.g., a package substrate, a circuit board, or an interposer), having electrical interconnect and bond pads, a PD die, and an optical input device. The PD die includes a PD, having an active area integrated proximate to a first face of the PD die, and further includes a lens, integrated on, or proximate to, a second face of the PD die, the second face being opposite the first face. The first face of the PD die is closer to the support structure than the second face, i.e., the first face of the PD die faces the support structure, while the second face (also referred to herein as a "backside") of the PD die faces the output of the optical input device that is configured to provide an optical input (i.e., light) to the lens, the optical input to be detected by the PD. Because the lens is integrated on, or proximate to, the backside of the PD die, the PD die may be referred to as a "backside lens-integrated PD die."

The optical receiver packages/architectures described may provide an improvement for the optical alignment tolerance issues, especially for high-speed operation in which the active aperture of the PD may have to be very small. In particular, by integrating a focus lens on the backside of a PD die, misalignment tolerance between the output of the optical input device and the PD may be enlarged, even for a small PD aperture as small as about 13 micrometers in diameter. When integrated on a single chip, alignment between the PD and the lens may, advantageously, be controlled by lithography, which enables tight accuracy that is not achievable using a discrete lens. In addition, with an integrated optical receiver chip, receiver package performance and assembly yield may be improved due to fewer discrete components in the assembly and more accurate front and back silicon registration error. Furthermore, the optical receiver packages described herein advantageously enable integrating a focus lens in a PD die that may be coupled to the support structure in a flip-chip arrangement.

Each of the structures, assemblies, packages, methods, devices, and systems of the present disclosure may have several innovative aspects, no single one of which being solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices. The term "circuit" means one or more passive and/or active components that are arranged to cooperate with one another to provide a desired function. The terms "substantially," "close," "approximately," "near," and "about," generally refer to being within +/−20% of a target value (e.g., within +/−5 or 10% of a target value) based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. When used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Furthermore, in the drawings, some schematic illustrations of example structures of various structures, devices, and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometers. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

A Photodetector Chip with a Lens Integrated on a Backside

FIG. 1 is a schematic illustration of an optical receiver package 100 with a backside lens-integrated PD die, according to some embodiments of the present disclosure.

As shown, the optical receiver package 100 may include a support structure 102, which may be referred to as a "PD support structure" because may be used to provide mechanical, and, optionally, also electrical, support for a PD die 104. In various embodiments, the PD support structure 102 may be any one of a substrate (e.g., a package substrate as described with reference to FIG. 5), an interposer (e.g., an interposer as described with reference to FIG. 5 or 6), or a circuit board (e.g., a circuit board as described with reference to FIG. 6).

As also shown in FIG. 1, the PD die 104 may include a PD 106 and a focus lens 108. Light may be provided to the PD 106 from an optical input device 110, where thick black arrows extending in FIG. 1 from the optical input device 110 to the PD 106 schematically illustrate the paths that various portions of the light may traverse. The PD 106 is configured to convert light incident thereon to electrical signals. FIG. 1 further illustrates that, in some embodiments, the optical receiver package 100 may further include one or more electronic components 112 (only one of which is shown in FIG. 1), electrically coupled to the PD die 104, and configured to provide any suitable processing of the electrical signals generated by the PD 106.

The PD die 104 may include a first face 116 and an opposing second face 118. The PD 106 may be proximate to or provided on the first face 116, in case the PD die 104 is attached to the support structure 102 in a flip-chip (also referred to as "controlled collapse chip connection," C4) configuration, as illustrated in FIG. 1. FIG. 1 illustrates only one PD 106 in order to not clutter the drawing, but, in various embodiments of the assembly 100, any number of one or more PDs 106 may be implemented on the PD die 104. In various embodiments, the PD 106 may include any suitable means, e.g., a photodiode, for detecting light incident thereon and for generating electrical signals indicative of the detected light.

In general, the light provided to the PD 106 from the optical input device 110 may include any electromagnetic signals having information encoded therein (or, phrased differently, any electromagnetic signals modulated to include information). Often times, the electromagnetic signals are signals associated with optical amplitudes, phases, and wavelengths and, therefore, descriptions provided herein refer to "optical" signals (or light) and "optical" components (e.g., "optical input device 110"). However, the optical receiver packages 100 with PD dies with integrated backside lenses, as described herein, are not limited to operating with electromagnetic signals of optical spectrum and descriptions provided herein with reference to optical signals and/or optical components are equally applicable to electromagnetic signals of any suitable wavelength, such as electromagnetic signals in near-infrared (NIR) and/or infrared (IR) bands, as well as electromagnetic signals in the radio frequency (RF) and/or microwave bands.

In some embodiments, the light may be provided to, or guided by the optical input device 110 may be transmitted by a photonic IC (PIC), which may, e.g., include an electromagnetic source, a modulator, and an electromagnetic signal launcher. In some embodiments, an electromagnetic source of a PIC may include 1) an oscillator, if the PIC supports wavelengths on the millimeter scale, 2) a laser, if the PIC supports wavelengths between about 0.8 and 1.7 micrometer, or 3) some combination of an oscillator and a laser, if the PIC supports wavelengths between 0.8 micrometer and millimeters or centimeters. In some embodiments, a modulator of a PIC may be any device/component configured to encode information in/on to the electromagnetic signals. In some embodiments, an electromagnetic signal launcher of a PIC may include any component configured to feed, or launch, the electromagnetic signal into the medium of propagation. In some embodiments, an electromagnetic signal launcher may further be configured to perform a frequency or wavelength multiplexing function, e.g., frequency division multiplexing (FDM) or wavelength division multiplexing (WDM). Some examples of PICs include, but are not limited to, optical transmitter output waveguides and their associated sub-components. In other examples, the optical input device 110 itself may be considered to be a PIC because it transmits electromagnetic signals having information encoded therein. For example, the optical input device 110 may include, or be, an optical receiver input waveguide, e.g., a silicon photonic waveguide, e.g., those based on silicon-on-isolator (SOI) platform, configured to guide electromagnetic radiation of any wavelength bands from about 0.8 micrometer to about 5 centimeter. For example, the optical input device 110 supporting wavelengths from about 1.2 micrometer to about 1.7 micrometer (i.e., wavelengths in the NIR and/or IR bands) may be used for data communications and telecommunications. In another example, the optical input device 110 supporting wavelengths from about 1 millimeter to about 10 millimeter (i.e., wavelengths in the extremely high frequency (EHF) band of radio/micro-waves), in particular, wavelengths of about 2 millimeter, may be used for radar and RF wireless communications.

The PD die 104 may include a substrate that may include any material that may serve as a foundation for the PD 106. In some embodiments, the substrate of the PD die 104 may be a semiconductor substrate composed of semiconductor material systems including, for example, N-type or P-type materials systems. The substrate of the PD die 104 may include, for example, a crystalline substrate formed using a bulk silicon (or other bulk semiconductor material) or a SOI structure (or, in general, a semiconductor-on-insulator structure). In some embodiments, the substrate of the PD die 104 may be formed using alternative materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, the substrate of the PD die 104 may be non-crystalline. In some embodiments, the substrate of the PD die 104 may be a printed circuit board (PCB). In some embodiments, the substrate of the PD die 104 may be inhomogeneous, e.g., including a carrier material (such as glass or silicon carbide) with a thin semiconductor layer at the second or upper face 118. Although a few examples of the substrate of the PD die 104 are described here, any material or structure that may serve as a foundation upon which the PD 106 may be built falls within the spirit and scope of the present disclosure. The substrate of the PD die 104 may be part of a singulated die or a wafer.

As shown in FIG. 1, a plurality of conductive contacts 120 may be disposed at the first face 116 of the PD die 104. Conductive pathways (not specifically shown in FIG. 1) may extend and be coupled between the conductive contacts 120 and the various ICs implemented in the PD die 104, e.g., the PD 106, where, in various embodiments, such conductive pathways may be implemented as conductive vias, conductive lines, and/or any combination of conductive vias and lines. In various embodiments, the conductive contacts 120 may be formed of any suitable conductive material. The conductive contacts 120 may take form of, e.g., solder bond pads, conductive epoxies, anisotropic conductive films, copper to copper bonding posts, or any other first-level interconnect structures, to route electrical signals to/from the PD die 104, as discussed herein.

The support structure 102 may include a first face 122 and an opposing second face 124. Conductive contacts 126 may be disposed at the second face 124 of the support structure 102, as shown in FIG. 1. In some embodiments, similar conductive contacts may be disposed at the first face 122 (not specifically shown in FIG. 1). In such embodiments, conductive pathways (also not specifically shown in FIG. 1) may extend through an insulating material of the support structure 102 between the first face 122 and the second face 124 of the support structure 102, electrically coupling various ones of the conductive contacts 126 at the second face 124 to various ones of the conductive contacts at the first face 122, in any desired manner. In some embodiments, the insulating material of the support structure 102 may be a dielectric material, e.g., any of the suitable materials typically used as an interlayer dielectric (ILD). Examples of the insulating material of the support structure 102 may include, in some embodiments, silicon oxide, silicon nitride, aluminum oxide, and/or silicon oxynitride. The conductive pathways through the support structure 102 may include one or more conductive vias, one or more conductive lines, or a combination of conductive vias and conductive lines, for example.

In some embodiments, the support structure 102 may be or may otherwise include a silicon interposer, and the conductive pathways through the support structure 102 may be through-silicon vias. Silicon may have a desirably low coefficient of thermal expansion compared with other dielectric materials that may be used, and thus may limit the degree to which the support structure 102 expands and contracts during temperature changes relative to such other materials (e.g., polymers having higher coefficients of thermal expansion). A silicon interposer may also help the support structure 102 achieve a desirably small line width and maintain high connection density to the PD die 104.

In some embodiments, the support structure 102 may be a substrate, e.g., any one of the substrates described above with reference to the PD die 104.

As shown in FIG. 1, the conductive contacts 120 of the PD die 104 may be electrically coupled to the conductive contacts 126 of the support structure 102 via first-level interconnects 128. In some embodiments, the first-level interconnects 128 may include solder bumps or balls (as illustrated in FIG. 1). For example, the first-level interconnects 128 may be flip-chip, or C4, bumps disposed initially on the PD die 104 or on the support structure 102. In some embodiments, the PD die 104 may be brought in contact with the support structure 102 using a pick-and-place apparatus, for example, and a reflow or thermal compression bonding operation may be used to couple the PD die 104 to the support structure 102 via the first-level interconnects 128.

Second-level interconnects (e.g., solder balls or other types of interconnects; not specifically shown in FIG. 1) may be present on the first face 122 of the support structure 102, to couple the support structure 102 to another component, such as a circuit board (not specifically shown in FIG. 1).

Having first-level interconnects 128 disposed between the first face 116 of the PD die 104 and the second face 124 of the support structure 102 (e.g., using solder bumps as part of flip-chip packaging techniques) may enable the optical receiver package 100 to achieve a smaller footprint and higher die-to-package-substrate connection density than could be achieved using conventional wirebond techniques (in which conductive contacts between the PD die 104 and the support structure 102 are constrained to be located on the periphery of the PD die 104). For example, a PD die 104 having a square first face 116 with side length N may be able to form 4N wirebond interconnects to the support structure 102, versus $N^2$ flip-chip interconnects (utilizing the entire "full field" surface area of the first face 116). Additionally, in some applications, wirebond interconnects may generate unacceptable amounts of heat that may damage or otherwise interfere with the performance of the PD 106. Using the first-level interconnects 128 may enable the optical receiver package 100 to have much lower parasitic inductance relative to using wirebonds to couple the PD die 104 and the support structure 102, which may result in an improvement in signal integrity for high-speed signals that may be communicated between the PD die 104 and the support structure 102.

Various conductive contacts used in the optical receiver package 100, e.g., the conductive contacts 120 and/or 126, may include multiple layers of material that may be selected to serve different purposes. In some embodiments, the conductive contacts used in the optical receiver package 100 may be formed of aluminum, and may include a layer of gold (e.g., with a thickness of less than 1 micron) between the aluminum and the adjacent interconnect to limit the oxidation of the surface of the contacts and improve the adhesion with adjacent solder. Alternate materials for the surface finish include palladium, platinum, silver and tin. In some embodiments, the conductive contacts used in the optical receiver package 100 may be formed of aluminum, and may include a layer of a barrier metal such as nickel, as well as a layer of gold, or other appropriate material, wherein the layer of barrier metal is disposed between the aluminum and the layer of gold, and the layer of gold is disposed between the barrier metal and the adjacent interconnect. In such embodiments, the gold, or other surface finish, may protect the barrier metal surface from oxidation before assembly, and the barrier metal may limit the diffusion of solder from the adjacent interconnects into the aluminum.

In some embodiments, the surface of the PD die 104 around the contacts 120 may be coated with a material which is not wetted by, e.g., the solder material of the first-level interconnects 128. This material is generally known as a solder mask and can take any appropriate form, such as silicon nitride, aluminum oxide, and silicon oxide. The presence of this solder mask material enables solder mask defined contacts.

In some embodiments, a solder resist material (not specifically shown in FIG. 1) may be disposed around the conductive contacts 126. The solder resist material may be a polyimide or similar material, or may be any appropriate type of packaging solder resist material. In some embodiments, the solder resist material may be a liquid or dry film material including photoimageable polymers. In some embodiments, the solder resist material may be non-photoimageable.

In various embodiments, more or fewer elements described above may be included in the support structure 102 and the PD die 104, compared to what is shown in FIG.

1. In some embodiments, conductive lines of the PD die 104 and the support structure 102 may extend into and out of the plane of the drawing, providing conductive pathways to route electrical signals to and/or from various elements in the PD die 104.

The conductive vias and/or lines that provide the conductive pathways in/on the PD die 104 or/and in/on the support structure 102 may be formed using any suitable techniques. Examples of such techniques may include subtractive fabrication techniques, additive or semi-additive fabrication techniques, single Damascene fabrication techniques, dual Damascene fabrication techniques, or any other suitable techniques. In some embodiments, layers of insulator material, such as e.g. oxide material or nitride material, may insulate various structures in the conductive pathways from proximate structures, and/or may serve as etch stops during fabrication. In some embodiments, additional layers, such as e.g. diffusion barrier layers or/and adhesion layers may be disposed between conductive material and proximate insulating material. Diffusion barrier layers may reduce diffusion of the conductive material into the insulating material. Adhesion layers may improve mechanical adhesion between the conductive material and the insulating material.

As noted above, interconnect structures may be arranged within the PD die 104 and in the support structure 102 to route electrical signals according to a wide variety of designs. During operation of the PD 106, electrical signals (such as e.g. power, input/output (I/O) signals, including various control signals for external and internal control of the PD 106) may be routed to and/or from the PD 106 of the PD die 104 through the interconnects provided by the conductive contacts and conductive pathways of the PD die 104 and the support structure 102.

FIG. 1 illustrates one example conductive pathway within the support structure 102, shown as a conductive pathway 130, intended to provide an example of electrical coupling between the PD die 104 and a further electronic component 112 which may be implemented on a die that is separate from the PD die 104, but be coupled to the same support structure 102. In various embodiments, the electronic component 112 may be, or include, one or more voltage converters, trans-impedance amplifiers (TIA), clock and data recovery (CDR) components, microcontrollers, etc.

Turning to the lens 108, FIG. 1 illustrates that, instead of being provided as a separate, discrete component, the lens 108 may be integrated on the backside 118 of the PD die 104. The lens 108 may be aligned with the optical input device 110 and the PD 106 so that optical signals may be provided from the optical input device 110 to the PD 106, to be detected by the PD 106. The alignment is further described below, with reference to FIG. 3.

Figure 2A:
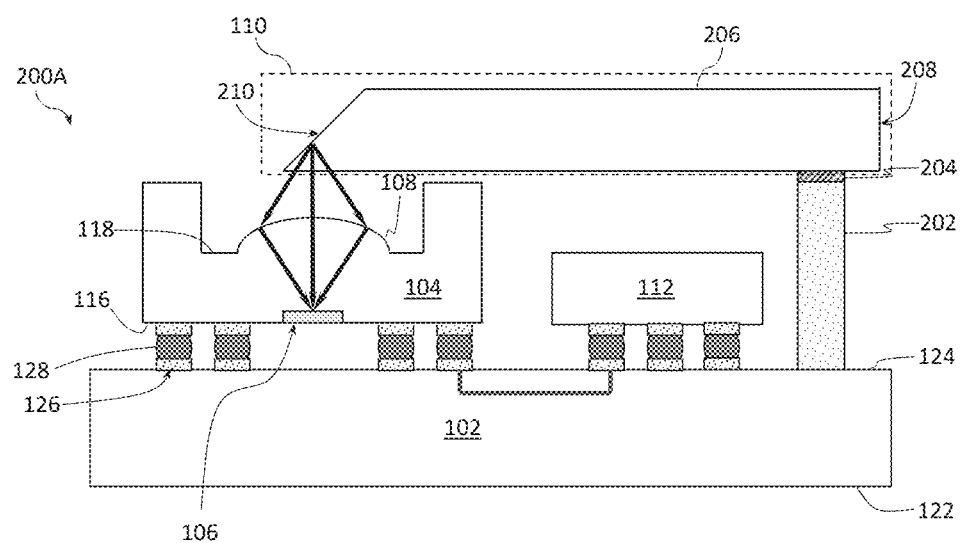
FIGS. 2A-2B are cross-sectional side views of example optical receiver packages with a backside lens-integrated PD die, according to various embodiments of the present disclosure.
Figure 2B:
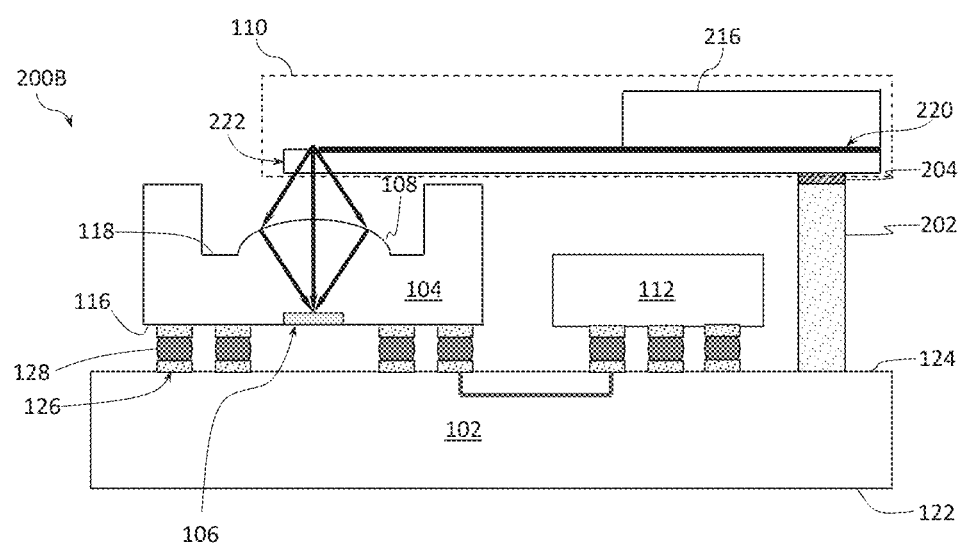
Figure 3:
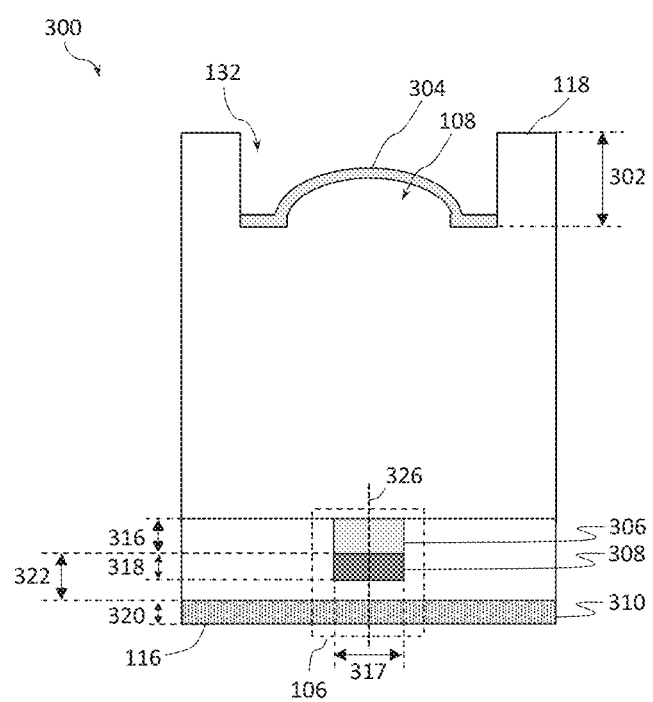
FIG. 3 is a cross-sectional side view of an example backside lens-integrated PD die, according to some embodiments of the present disclosure.

In some embodiments, the lens 108 may be provided within a recess 132 in the backside 118 of the PD die 104, as shown in FIGS. 1-3. In other embodiments, not shown in the present figures, the lens 108 may at least partially protrude from the backside 118 of the PD die 104. The lens 108 may be any structure configured to optically couple the optical signals from the output of the optical input device 110 to the PD 106 integrated at, or near, the front side 116 of the PD die 104 so that optical signals may be detected by the PD 106.

FIG. 2A is a cross-sectional side view of an example optical receiver package 200A with a backside lens-integrated PD die, according to some embodiments of the present disclosure. The optical receiver package 200A may be seen as an example implementation of the optical receiver package 100, shown in FIG. 1, with further details shown in FIG. 2A. Descriptions of the optical receiver package 100 provided with reference to FIG. 1 are applicable to the optical receiver package 200A shown in FIG. 2A and, therefore, in the interests of brevity, are not repeated. Instead, only additional features or differences are described.

As shown in FIG. 2A, in some embodiments, the optical input device 110 may be supported over the PD die 104 by means of a spacer structure 202. The spacer structure 202 may include a structure of any suitable material and geometry for providing mechanical support for at least a portion of the optical input device 110 so that the optical input device 110 may be arranged over the PD die 104 so that optical signals output from the optical input device 110 may be incident onto the lens 108, to be detected by the PD 106. For example, in some embodiments, the spacer structure 202 may be arranged to suspend a portion of the optical input device 110 over the PD die 104 so that optical signals output from the optical input device 110 may be incident onto the lens 108, as shown in FIG. 2A. In some embodiments, the spacer structure 202 may be formed of a material that has sufficiently low coefficient of thermal expansion, e.g., below about 7 parts per million per degree Centigrade (ppm/° C.), preferably below about 2-3 ppm/° C. Some examples of materials which may be used to form the spacer structure 202 include, but are not limited to, silicon, ceramic, borosilicate glass, quartz or silica.

As further shown in FIG. 2A, in some embodiments, a portion of the optical input device 110 may be attached to at least a portion of the spacer structure 202 using any suitable attachment means 204, such as any suitable epoxy material (e.g., ultraviolet (UV) cure epoxy and/or thermal cure epoxy) and/or soldering. Thus, in some embodiments, a portion of the optical input device 110 may be attached to the spacer structure 202 using epoxy and/or soldering. In other embodiments, a portion of the optical input device 110 may be attached to the spacer structure 202 using laser curling, laser welding, or any attachment means that solidifies in a relatively short time and with relatively little movement.

In various embodiments, one or more of location, geometry, and the number of spacer structures 202 used in the optical receiver package 200A may be different from that shown in FIG. 2A. In particular, although not specifically shown in FIG. 2A, in some embodiments, the optical receiver package 200A may include multiple spacer structures 202 used to provide mechanical support for the optical input device 110.

Turning to the details of the optical input device 110, FIG. 2A illustrates an embodiment where the optical input device 110 is implemented as a waveguide 206. The waveguide 206 may be seen as a total internal reflection (TIR) mirror structure, which may be used to guide light in a direction substantially parallel to the support structure 102. The waveguide 206 may include a wide end 208 into which light from a fiber, such as a multi-mode optical fiber may be input. The waveguide 206 may also include a tapered, or wedge, end 210 where the waveguide 206 narrows at the bottom. The tapered end 210 may have a reflective surface to direct the light, traveling through the waveguide 206 substantially parallel to the support structure 102, to be reflected downwards, towards the lens 108. In some embodiments, the end 210 may be wedged at an angle smaller than 43 degrees to both improve assure the TIR and send the chief ray deliberately off the optical axis of the lens to reduce back-coupling of the light into the waveguide 206.

In some embodiments, a de-multiplexer may optionally be fabricated into the waveguide 206. For example, the de-multiplexer may be implemented as a diffraction grating, such as an etched Echelle grating. In other examples, the de-multiplexer may be implemented as an arrayed waveguide grating (AWG) de-multiplexer, a thin-film-filter (TFF) de-multiplexer, or a single-mode waveguide. In various embodiments, the de-multiplexer of the waveguide 206 may be capable of de-multiplexing both single-mode and multi-mode beams.

FIG. 2B is a cross-sectional side view of an example optical receiver package 200B with a backside lens-integrated PD die, according to other embodiments of the present disclosure. The optical receiver package 200B may be seen as an example implementation of the optical receiver package 100, shown in FIG. 1, with further details shown in FIG. 2B. Descriptions of the optical receiver package 100 provided with reference to FIG. 1 are applicable to the optical receiver package 200B shown in FIG. 2B and, therefore, in the interests of brevity, are not repeated. Instead, only additional features or differences are described.

As shown in FIG. 2B, similar to FIG. 2A, in some embodiments of the optical receiver package 200B, the optical input device 110 may be supported over the PD die 104 by means of the spacer structure 202, possibly attached with the attachment means 204, as described above. FIG. 2B differs from FIG. 2A in that it illustrates that the optical input device 110 may be implemented as a fiber assembly unit (FAU) 216. As shown in FIG. 2B, the FAU 216 may include, or be coupled to, a fiber or a fiber array 220, configured to guide the optical signals in a direction substantially parallel to the support structure 102. In some embodiments, the FAU 216 may include a lid portion 222, configured to ensure that the light can be directed from the fiber 220 towards the lens 108. In other embodiments, the FAU 216 may include a wavelength de-multiplexer (e.g., 208 shown in FIG. 2A), configured to split the incoming multi-wavelength optical beam into multiple beams towards to the lens 108.

Next, details of the PD die 104 will be described with reference to FIG. 3, providing a cross-sectional side view of an example backside lens-integrated PD die 300, according to some embodiments of the present disclosure. The PD die 300 may be seen as an example implementation of the PD die 104, shown in FIG. 1 and in FIGS. 2A-2B, with further details shown in FIG. 3. Descriptions of the PD die 104 provided with reference to FIG. 1 are applicable to the PD die 300 shown in FIG. 3 and, therefore, in the interests of brevity, are not repeated. Instead, only additional features or differences are described.

FIG. 3 illustrates that, in some embodiments, the lens 108 may be provided within the recess 132 on the backside 118 of the PD die 300. In some embodiments, a depth of the recess 132, shown in FIG. 3 as a dimension 302, may be is between about 3 micrometers and 20 micrometers. Forming the lens 108 in the recess 132 in the backside 118 of the PD die may be advantageous in terms of wafer handling without the risk of damaging the surface of the lens 108.

FIG. 3 further illustrates that, in some embodiments, the surface of the lens 108 may be at least partially covered with an antireflection (AR) coating 304. The AR coating 304 may include any suitable material(s) adapted to reduce reflection, thereby improving the efficiency since less light incident onto the lens 108 from the optical input device 110 is lost due to reflection. In some embodiments, the AR coating 304 may include a plurality of AR coating layers, e.g., alternating transparent thin-film layers with contrasting refractive index. Materials of the layers and layer thicknesses may be chosen to produce destructive interference in the beams reflected form the interfaces, and to produce constructive interference in the corresponding transmitted beams.

FIG. 3 also illustrates an example implementation of the PD 106. In particular, as shown in FIG. 3, in some embodiments, the PD 106 may include an active area 306, comprising a suitable photosensitive material, as well as a dielectric portion 308 that may include one or more dielectric layers, and a back reflection mirror 310.

The active area 306 may include a semiconductor material, e.g. germanium. In some embodiments, a thickness of the active area 306, shown in FIG. 3 as a dimension 316, may be between about 0.2 micrometers and 1.5 micrometers, including all values and ranges therein. In some embodiments, the thickness 316 of the active area 306 may be selected to optimize the PD transit-time bandwidth and responsivity. In some embodiments, a diameter of the active area 306, shown in FIG. 3 as a dimension 317, may be between a few of micrometers to few tens of micrometers, e.g., selected to optimize the PD parasitic bandwidth. As shown in FIG. 3, the active area 306 may be disposed between the first side 116 of the PD 300 and the lens 108, e.g., between the back reflection mirror 310 or the dielectric portion 308, and the lens 108.

The dielectric portion 308 may include multiple dielectric layers such as oxide and silicon nitride layers, configured to enhance optical back reflection from the back reflection mirror 310. In some embodiments, a total thickness of the dielectric portion 308, shown in FIG. 3 as a dimension 318, may be between about 0.1 micrometers and 3 micrometers, including all values and ranges therein. As shown in FIG. 3, the dielectric portion 308 may be disposed between the active area 306 and the back reflection mirror 310.

The back reflection mirror 310 may include a layer of a reflective material at the first face 116 of the PD die 300, configured to increase optical absorption in the active area 306, and, consequently, increase the responsivity of the PD 106, by providing a double optical path for the light to travel through and be absorbed by the active area 306. When the back reflection mirror 310 is used, then, first, the light may travel from the lens 108 towards the back reflection mirror 310, traversing the active area 306, then get reflected from the back reflection mirror 310 and travel back up towards and traversing the active area 306 again. The back reflection mirror 310 may, e.g., include a layer of metal such as copper. In some embodiments, such a metal back reflection mirror 310 may serve as a metal contact for the PD 106. In some embodiments, a thickness of the back reflection mirror 310, shown in FIG. 3 as a dimension 320, may be between about 0.5 micrometers and 3 micrometers, including all values and ranges therein. In some embodiments, a distance between the active area 306 and the back reflection mirror 310, shown in FIG. 3 as a dimension 322, may be between about 0.2. micrometers and 5 micrometers, including all values and ranges therein, e.g., between about 0.2 and 3 micrometers or between about 0.2 and 2 micrometers.

For maximum absorption, the active area 306 of the PD 106 should be substantially aligned with the lens 108. In particular, an optical axis of the lens 108 (shown in FIG. 3 as an axis 328) may be aligned with an optical axis of the active area 306 (shown in FIG. 3 as an axis 326). For example, in some embodiments, a distance between the optical axis 326 of the active area 306 of the PD 106 and the optical axis 328 of the lens 108 (i.e., the misalignment between the active area 306 of the PD 106 and the lens 108) may be less than about 5 micrometers, including all values and ranges therein, e.g., less than about 3 micrometers, or less than about 1-5 micrometers. Integrating both the lens 108 and the active area 306 in a single PD die 300 advantageously allows controlling the alignment between the lens 108 and the active area 306 by controlling lithographic processes used to fabricate the active area of the PD and the lens, thereby enabling tight accuracy.

Various assemblies with a backside lens-integrated PD die as described herein, e.g., any of the embodiments of the optical receiver package 100, described herein, some of which are illustrated in FIGS. 1-3, do not represent an exhaustive set of arrangements utilizing backside integrated lens in a manner that allows providing improved optical alignment between the optical input device and the PD, but merely provide examples of such arrangements. Although particular arrangements of materials are discussed with reference to FIGS. 1-3 illustrating example optical receiver assemblies, in some embodiments, various intermediate materials may be included in various portions of the assemblies of these figures.

Note that FIGS. 1-3 are intended to show relative arrangements of the components within their assemblies, and that, in general, such assemblies may include other components that are not illustrated (e.g., various interfacial layers or various other components related to, e.g., optical functionality, electrical connectivity, or thermal mitigation). For example, in some further embodiments, the optical receiver assemblies as shown in FIGS. 1-3 may include multiple PDs 106 and multiple corresponding lenses 108, integrated on the opposite side of the same PD die 104. In another example, the optical receiver packages shown in FIGS. 1 and 2 may include multiple PDs 104 and/or multiple other electronic components 112.

Additionally, although some components of the assemblies are illustrated in FIGS. 1-3 as being planar rectangles or formed of rectangular solids, this is simply for ease of illustration, and embodiments of these assemblies, in particular embodiments of the recess 132 in the PD die 104, or embodiments of other portions of the PD die 104 and the PD 106, may be curved, rounded, or otherwise irregularly shaped as dictated by, and sometimes inevitable due to, the manufacturing processes used to fabricate various components.

In various embodiments, any of the features discussed with reference to any of FIGS. 1-3 herein may be combined with any other features to form an optical receiver package with one or more backside lens-integrated PD dies as described herein, e.g., to form a modified optical receiver package 100 or a modified PD die 300. Some such combinations are described above, but, in various embodiments, further combinations and modifications are possible.

Manufacturing Optical Receiver Packages with Backside Lenses Integrated in PD Dies Various optical receiver packages with backside lenses integrated in PD dies as disclosed herein may be manufactured using any suitable techniques. For example, in some implementations, a choice of fabrication processes may depend on how the PD die 104 is coupled to the support structure 102 (e.g., using a flip-chip arrangement as described above, or using some other arrangement). In another example, in some implementations, a choice of a technique may depend on whether the lens 108 is to be provided in a recess on the backside 118 of the PD die 104 or protruding from the backside 118.

Figure 4:
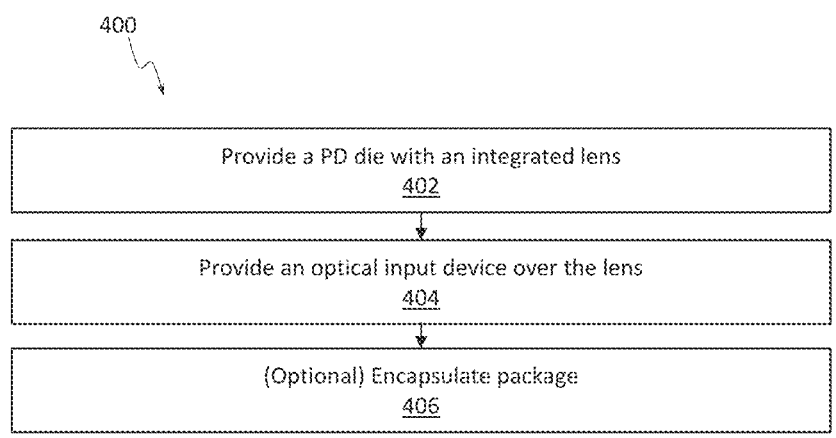
FIG. 4 is a flow diagram of an example method of fabricating an optical receiver package with a backside lens-integrated PD die, according to various embodiments of the present disclosure.

FIG. 4 is a flow diagram of an example method 400 of fabricating an optical receiver package with a backside lens-integrated PD die, according to various embodiments of the present disclosure.

Although the operations of the method 400 are illustrated in FIG. 4 once each and in a particular order, the operations may be performed in any suitable order and repeated as desired. For example, one or more operations may be performed in parallel to manufacture multiple backside lens-integrated PD dies, or to manufacture multiple optical receiver packages with such PD dies, substantially simultaneously. In another example, the operations may be performed in a different order to reflect the structure of a particular optical receiver package in which one or more backside lens-integrated PD dies as described herein may be included.

Furthermore, the operations illustrated in FIG. 4 may be combined or may include more details than described. For example, a process 404 and a process 406 may happen in a single process step, e.g., when an optical input device provides an encapsulation of at least a portion of the optical receiver package. In another example, the process 402 of providing a PD die with an integrated lens may include multiple processes, e.g., one or more processes to provide a PD on one side of the PD die and one or more processes to provide a lens on another side of the PD die, or multiple processes used to provide flip-chip connections between dies and support structures.

Still further, the method 400 shown in FIG. 4 may further include other manufacturing operations related to fabrication of other components of the optical receiver assemblies described herein, or any devices that may include optical receiver assemblies as described herein. For example, the method shown in FIG. 4 may include various cleaning operations, surface planarization operations (e.g., using chemical mechanical polishing), operations for surface roughening, operations to include barrier and/or adhesion layers as desired, and/or operations for incorporating the optical receiver packages as described herein in, or with, an IC component, a computing device, or any desired structure or device.

The method 400 shown in FIG. 4 may begin with a process 402 that includes providing a PD die with an integrated lens. For example, the process 402 may include providing the PD die 104 having the PD 106 provided on, or proximate to, one face of the PD die 104, and having the lens 108 provided on, or proximate to, an opposing face of the PD die 104, as described herein. In some embodiments, such a PD die may be provided in a flip-chip configuration with the support structure 102, as described above.

The method 400 may include a process 404 of providing an optical input device. For example, the process 404 may include providing the optical input device 110 aligned above the lens 108 of the PD die 104, described above.

The method 400 may include an optional process 406 of encapsulating the entire assembly. For example, the process 406 may include providing a layer of a suitable dielectric material over the optical receiver package as shown in FIG. 1 or 2, e.g., to reduce or minimize oxygen, moisture, or various other external compounds reaching the PD 106 and/or other components of the optical receiver package.

Example Devices and Components

Figure 5:
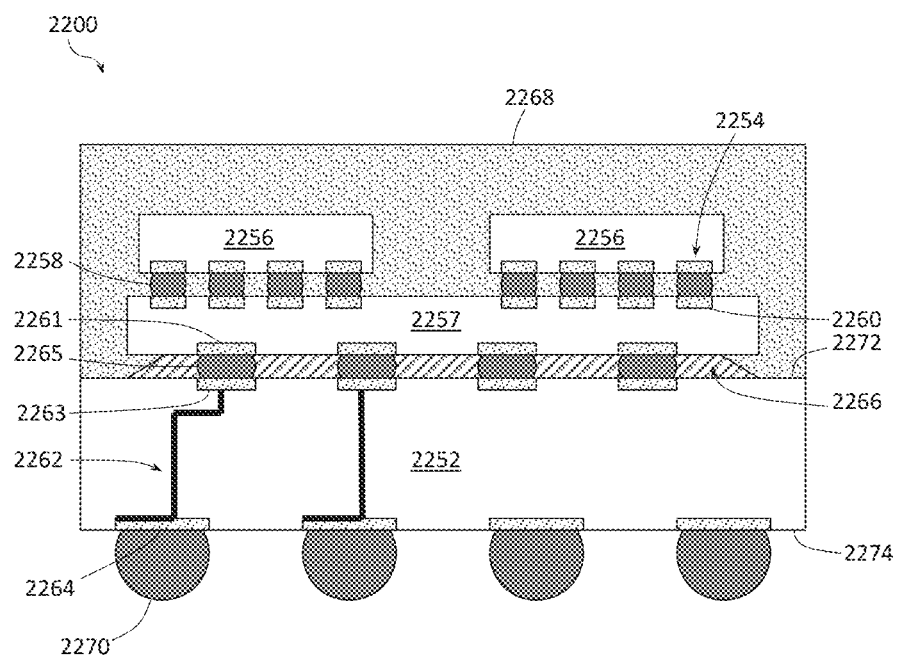
FIG. 5 is a cross-sectional side view of a device package that may include one or more optical receiver packages with backside lens-integrated PD dies in accordance with any of the embodiments disclosed herein.
Figure 6:
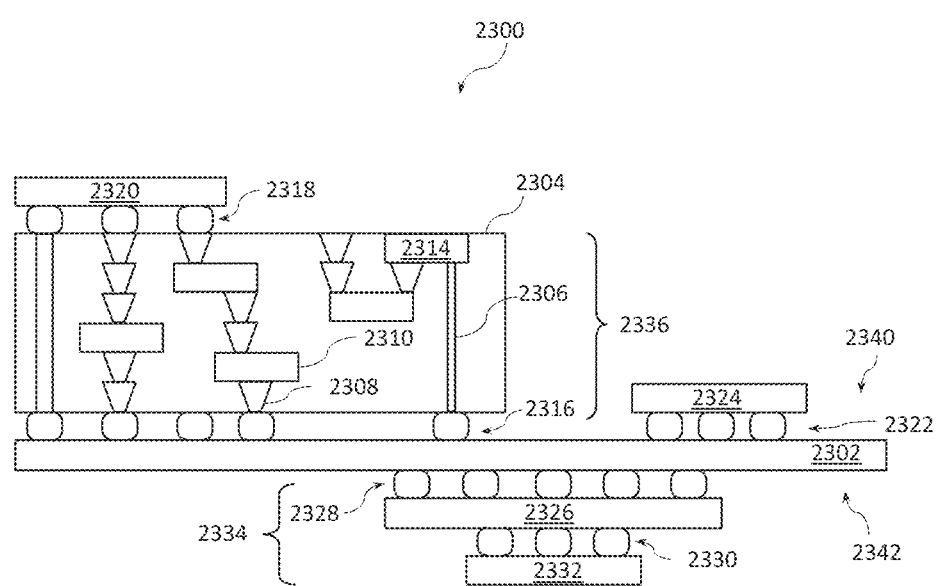
FIG. 6 is a cross-sectional side view of a device assembly that may include one or more optical receiver packages with backside lens-integrated PD dies in accordance with any of the embodiments disclosed herein.
Figure 7:
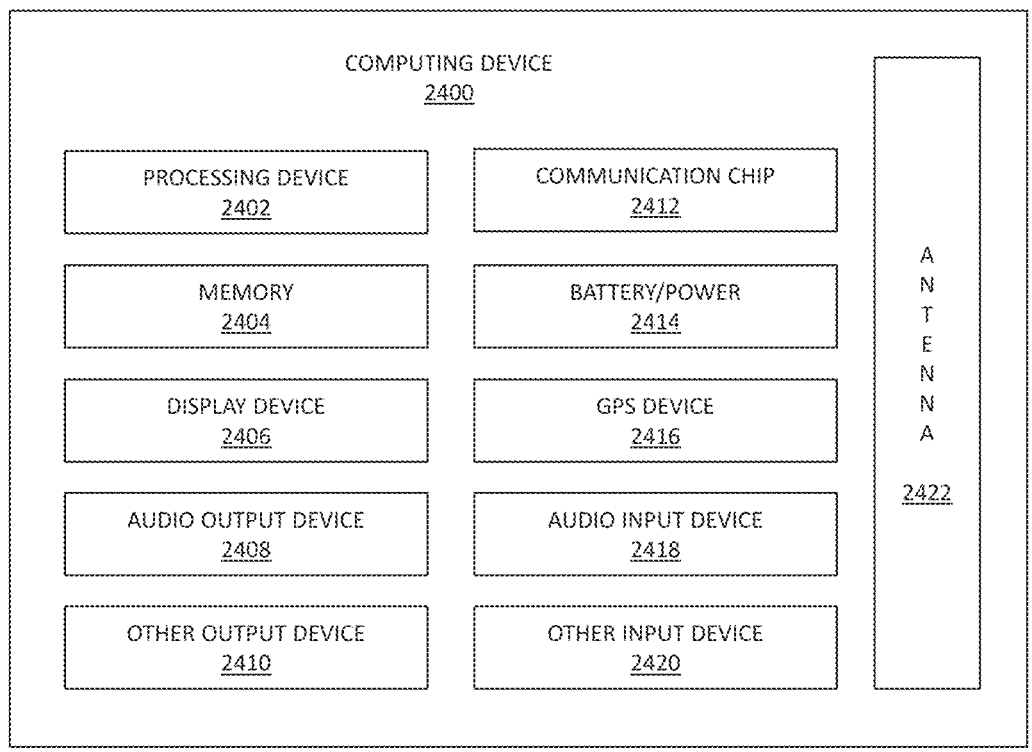
FIG. 7 is a block diagram of an example computing device that may include one or more optical receiver packages with backside lens-integrated PD dies in accordance with any of the embodiments disclosed herein.

The optical receiver packages with backside lens-integrated PD dies disclosed herein, e.g., any of the embodiments of the optical receiver packages shown in FIGS. 1-3 or any further embodiments described herein, may be included in any suitable electronic/photonic component. FIGS. 5-7 illustrate various examples of packages, assemblies, and devices that may be used with or include any of the optical receiver packages with backside lens-integrated PD dies as disclosed herein.

FIG. 5 is a side, cross-sectional view of an example IC package 2200 that may include optical receiver packages with backside lens-integrated PD dies in accordance with any of the embodiments disclosed herein. In some embodiments, the IC package 2200 may be a system-in-package (SiP).

As shown in FIG. 5, the package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274. These conductive pathways may take the form of any of the interconnect structures comprising lines and/or vias, e.g., as discussed above with reference to FIG. 1.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 5 are solder bumps, but any suitable first-level interconnects 2265 may be used, such as solder bumps, solder posts, or bond wires. In the embodiments where the interposer 2257 is used, the interposer 2257 may be the support structure 102, described above.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 5 are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 5 are solder balls (e.g., for a ball grid array arrangement), but any suitable second-level interconnects 2270 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 6.

In various embodiments, any of the dies 2256 may include the PD die 104 as described herein, aligned with the optical input device 110, as described herein. The details of the PD die 104 and the optical input device 110 are not specifically shown in FIG. 5 in order to not clutter the drawing. However, in all such embodiments, for the dies 2256 that are implemented as the PD die 104, the conductive contacts 2254 of the die 2256 may be analogous to the conductive contacts 120 described above, the interconnects 2258 may be analogous to the interconnects 128 described above, and the conductive contacts 2260 of the interposer 2257 may be analogous to the conductive contacts 126 described above.

In embodiments in which the IC package 2200 includes multiple dies 2256, the IC package 2200 may be referred to as a multi-chip package (MCP). The dies 2256 may include circuitry to perform any desired functionality. For example, besides one or more of the dies 2256 being PD dies 104 as described herein, one or more of the dies 2256 may be logic dies (e.g., silicon-based dies), one or more of the dies 2256 may be memory dies (e.g., high bandwidth memory), etc. In some embodiments, any of the dies 2256 which are implemented as PD dies 104 may include one or more associated optical input devices 110, e.g., as discussed with reference to FIGS. 1-3. In some embodiments, at least some of the dies 2256 may not include any PDs or any backside integrated lenses as described herein.

Although the IC package 2200 illustrated in FIG. 5 is a flip-chip package, other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 5, an IC package 2200 may include any desired number of dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

In some embodiments, no interposer 2257 may be included in the IC package 2200; instead, the dies 2256 may be coupled directly to the conductive contacts 2263 at the face 2272 by first-level interconnects 2265. In such embodiments, the package substrate 2252 may be analogous to the support structure 102 described above, and, for the dies 2256 that are implemented as the PD die 104 optically coupled to the optical input device 110, the conductive contacts 2254 of the dies 2256 may be analogous to the conductive contacts 120 described above, the interconnects 2265 may be analogous to the interconnects 128 described above, and the conductive contacts 2263 of the package substrate 2252 may be analogous to the conductive contacts 126 described above.

FIG. 6 is a cross-sectional side view of an IC device assembly 2300 that may include components having one or more optical receiver packages with backside lens-integrated PD dies in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the one or more optical receiver packages with a backside lens-integrated PD die in accordance with any of the embodiments disclosed herein; e.g., any of the IC packages discussed below with reference to the IC device assembly 2300 may take the form of any of the embodiments of the IC package 2200 discussed above with reference to FIG. 5.

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

FIG. 6 illustrates that, in some embodiments, the IC device assembly 2300 may include a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (as shown in FIG. 6), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. In some embodiments, the IC package 2320 may be or include the IC package 2200, e.g., as described above with reference to FIG. 5. In some embodiments, the IC package 2320 may include at least one PD die 104 as described herein, optically coupled to the optical input device 110, as described herein. The PD die 104 and the optical input device 110 are not specifically shown in FIG. 6 in order to not clutter the drawing.

Although a single IC package 2320 is shown in FIG. 6, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 to a BGA of the coupling components 2316 for coupling to the circuit board 2302. In such an example, the interposer 2304 may be analogous to the support structure 102, described above.

In the embodiment illustrated in FIG. 6, the IC package 2320 and the circuit board 2302 are attached to opposing sides of the interposer 2304. In other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to TSVs 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

In some embodiments, the IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

In some embodiments, the IC device assembly 2300 may include a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and/or 2332 may take the form of any of the embodiments of the IC package 2320 discussed above. The package-on-package structure 2334 may be configured in accordance with any of the package-on-package structures known in the art.

FIG. 7 is a block diagram of an example computing device 2400 that may include one or more components having one or more optical receiver packages with backside lens-integrated PD dies in accordance with any of the embodiments disclosed herein. For example, any suitable ones of the components of the computing device 2400 may include a PD die (e.g., the PD die 104 as shown in FIGS. 1-3) having a lens (e.g., the lens 108) integrated on its' backside, opposite the PD implemented at the other side of the PD die (e.g., the PD 106), in accordance with any of the embodiments disclosed herein. In another example, any one or more of the components of the computing device 2400 may include any embodiments of the IC package 2200 (e.g., as shown in FIG. 5). In yet another example, any one or more of the components of the computing device 2400 may include an IC device assembly 2300 (e.g., as shown in FIG. 6).

A number of components are illustrated in FIG. 7 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system-on-a-chip (SoC) die.

Additionally, in various embodiments, the computing device 2400 may not include one or more of the components illustrated in FIG. 7, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded dynamic random access memory (eDRAM) or spin transfer torque magnetic random access memory (STT-M RAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile Internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides an optical receiver package that includes a support structure and a PD die. The support structure may have one or more electrical interconnects and bond pads (e.g., 102 shown in FIG. 1). The PD die (e.g., 104 shown in FIG. 1), has a first face (e.g., 116 shown in FIG. 1) and an opposite second face (e.g., 118 shown in FIG. 1), where the first face of the PD die is closer to the support structure than the second face (i.e., the first face of the PD die faces the support structure), the PD die includes a PD (e.g., 106 shown in FIG. 1), having an active area (e.g., 306 shown in FIG. 3) integrated proximate to the first face, and the PD die includes a lens (e.g., 108 shown in FIG. 1) integrated at the second face. The optical receiver package further includes an optical input device (e.g., 110 shown in FIG. 1), configured to provide an optical input (i.e., light) to the lens, the optical input to be detected by the PD.

Example 2 provides the optical receiver package according to example 1, where the active area of the PD includes germanium. The PD may further include multiple dielectric layers such as oxide and silicon nitride, as well as metal contacts.

Example 3 provides the optical receiver package according to examples 1 or 2, where a thickness of the active area is between about 0.2. micrometers and 1.5 micrometers.

Example 4 provides the optical receiver package according to any one of the preceding examples, where the PD die further includes a back reflection mirror (e.g., 308 shown in FIG. 3) provided at the first face of the PD die.

Example 5 provides the optical receiver package according to example 4, where the active area is between the back reflection mirror and the lens.

Example 6 provides the optical receiver package according to examples 4 or 5, where a distance between the active area and the back reflection mirror is between about 0.2. micrometers and 5 micrometers, including all values and ranges therein, e.g., between about 0.2 and 3 micrometers or between about 0.2 and 2 micrometers.

Example 7 provides the optical receiver package according to any one of examples 4-6, where the back reflection mirror is a metal mirror (e.g., a layer of copper).

Example 8 provides the optical receiver package according to any one of examples 4-7, where the PD die further includes one or more dielectric layers, e.g. multiple dielectric layers such as oxide and silicon nitride (e.g., 308 shown in FIG. 3), between the active area and the back reflection mirror.

Example 9 provides the optical receiver package according to any one of the preceding examples, where the second face of the PD die includes a recess, and where the lens is provided in the recess.

Example 10 provides the optical receiver package according to example 9, where a depth of the recess is between about 3 micrometers and 20 micrometers.

Example 11 provides the optical receiver package according to any one of the preceding examples, further including an antireflection coating (e.g., 304 shown in FIG. 3) provided over the lens.

Example 12 provides the optical receiver package according to example 11, where the antireflection coating includes a plurality of antireflection coating layers.

Example 13 provides the optical receiver package according to any one of the preceding examples, where the support structure (e.g., 102 shown in FIG. 1) is one of a package substrate, an interposer, or a circuit board.

Example 14 provides the optical receiver package according to any one of examples 1-13, where the optical input device (e.g., 110 shown in FIG. 1) includes, or is, a waveguide.

Example 15 provides the optical receiver package according to example 14, where the waveguide includes a de-multiplexer.

Example 16 provides the optical receiver package according to example 15, where the de-multiplexer is an AWG de-multiplexer, an Echelle grating, a single-mode waveguide, or a TFF de-multiplexer.

Example 17 provides the optical receiver package according to any one of examples 1-13, where the optical input device (e.g., 110 shown in FIG. 1) includes, or is, a fiber assembly unit.

Example 18 provides the optical receiver package according to any one of the preceding examples, where the active area of the PD is substantially aligned with the lens.

Example 19 provides the optical receiver package according to example 18, where a distance between an optical axis of the active area of the PD and an optical axis of the lens is less than about 5 micrometers. Thus, in some embodiments, the misalignment between the active area of the PD and the lens may be less than about 5 micrometers for better performance, e.g., less than about 3 micrometers, or less than about 1-5 micrometers.

Example 20 provides the optical receiver package according to any one of the preceding examples, further including a spacer structure, to provide mechanical support for at least a portion of the optical input device, e.g., to suspend a portion of the optical input device over the PD die so that optical signals may be directed from the optical input device onto the lens, to be detected by the PD.

Example 21 provides the optical receiver package according to example 20, further including one or more of epoxy and soldering between the spacer structure and the optical input device.

Example 22 provides a method of fabricating a photonic package assembly. The method includes providing a photodetector (PD) die, having a first face and an opposite second face, where the PD die includes a PD, having an active area integrated proximate to the first face, and the PD die includes a lens integrated at the second face. The method also includes providing an optical input device, configured to provide an optical input (i.e., light) to the lens, the optical input to be detected by the PD.

Example 23 provides the method according to example 22, where providing the PD die includes forming a recess at the second face of the PD die, and forming the lens in the recess, as a part of forming the recess.

Example 24 provides the method according to examples 22 or 23, further including coupling a fiber-optic cable to the optical input device.

Example 25 provides the method according to any one of examples 22-24, further including encapsulating at least a portion of the PD die.

Example 26 provides the method according to any one of examples 21-25, further including processes to provide the optical receiver package according to any one of examples 1-21.

Example 27 provides an optical receiver package that includes a support structure, a PD die, a TIA, and an optical input device. The PD die is coupled to a first portion of the support structure in a flip-chip configuration, includes a lens and a PD, and is configured to generate a current signal indicative of light detected by the PD. The TIA is coupled to a second portion of the support structure in the flip-chip configuration, and is configured to convert the current signal to a voltage signal (thus, the support structure may provide electrical connectivity between the PD and the TIA). The optical input device is configured to provide the light to the PD (i.e., is configured to provide the light to be detected by the PD).

Example 28 provides the optical receiver package according to example 27, where the PD and the lens are integrated at opposite faces of the PD die.

Example 29 provides the optical receiver package according to examples 27 or 28, where the PD and the lens are substantially aligned (i.e., an optical axis of the PD is substantially aligned with an optical axis of the lens).

Example 30 provides the optical receiver package according to any one of examples 27-29, where an optical output of the optical input device is substantially aligned with the lens (i.e., an optical output of the optical input device is substantially aligned with an optical axis of the lens).

Example 31 provides the optical receiver package according to any one of examples 27-30, further including features of the optical receiver package according to any one of more of the preceding examples, e.g., according to any one or more of examples 1-21.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. An optical receiver package, comprising:
a support structure;
a photodetector (PD) die, having a first face and an opposite second face, wherein:
the first face of the PD die is closer to the support structure than the second face,
the PD die includes a PD, the PD having an active area integrated proximate to the first face, and
the PD die further includes a lens integrated at the second face; and
an optical input device, to provide an optical input to the lens, the optical input to be detected by the PD.

2. The optical receiver package according to claim 1, wherein the active area of the PD includes germanium.

3. The optical receiver package according to claim 1, wherein the PD die further includes a back reflection mirror at the first face, wherein the active area is between the back reflection mirror and the lens.

4. The optical receiver package according to claim 3, wherein a distance between the active area and the back reflection mirror is between 0.2. micrometers and 5 micrometers.

5. The optical receiver package according to claim 3, wherein the back reflection mirror is a metal contact.

6. The optical receiver package according to claim 3, wherein the PD die further includes one or more dielectric layers between the active area and the back reflection mirror.

7. The optical receiver package according to claim 1, wherein the second face includes a recess, and wherein the lens is in the recess.

8. The optical receiver package according to claim 1, further including an antireflection coating over the lens.

9. The optical receiver package according to claim 1, wherein the support structure is one of a package substrate, an interposer, or a circuit board.

10. The optical receiver package according to claim 1, wherein the optical input device includes an arrayed waveguide grating de-multiplexer, an Echelle grating, a single-mode waveguide, a thin-film-filter de-multiplexer, or a fiber assembly unit.

11. The optical receiver package according to claim 1, wherein the active area is aligned with the lens so that a distance between an optical axis of the active area and an optical axis of the lens is less than 5 micrometers.

12. The optical receiver package according to claim 1, further including a spacer structure, to provide mechanical support for at least a portion of the optical input device.

13. The optical receiver package according to claim 1, wherein the lens is monolithically integrated in the second face of the PD die.

14. The optical receiver package according to claim 1, wherein an optical axis of the active area of the PD is substantially parallel to an optical axis of the lens.

15. The optical receiver package according to claim 1, wherein the lens is in a direct path between an output of the optical input device and the active area, where the optical input exits the optical input device from the output of the optical input device.

16. A method of fabricating a photonic package assembly, the method comprising:
providing a photodetector (PD) die, having a first face and an opposite second face, wherein the PD die includes a PD, the PD having an active area integrated proximate to the first face, and wherein the PD die further includes a lens monolithically integrated at the second face; and
providing an optical input device, to provide an optical input to the lens, the optical input to be detected by the PD.

17. The method according to claim 16, wherein providing the PD die includes forming a recess at the second face of the PD die and forming the lens in the recess.

18. The method according to claim 16, further including encapsulating at least a portion of the PD die.

19. An optical receiver package, comprising:
a support structure;
a photodetector (PD) die, coupled to a first portion of the support structure in a flip-chip configuration, the PD die including a lens and a PD integrated at opposite faces of the PD die, the PD to generate a current signal indicative of light detected by the PD;

a trans-impedance amplifier (TIA), coupled to a second portion of the support structure in the flip-chip configuration, the TIA to convert the current signal to a voltage signal; and an optical input device, to provide the light to the PD.

20. The optical receiver package according to claim 19, wherein:

the opposite faces of the PD die are a first face and a second face, the first face of the PD die is closer to the support structure than the second face, an active area of the PD is integrated proximate to the first face, and the lens is integrated at the second face.

* * * * *